(12) United States Patent
Lee et al.

(10) Patent No.: US 11,189,699 B2
(45) Date of Patent: Nov. 30, 2021

(54) SUPERLATTICE STRUCTURE INCLUDING TWO-DIMENSIONAL MATERIAL AND DEVICE INCLUDING THE SUPERLATTICE STRUCTURE

(71) Applicants: Samsung Electronics Co., Ltd., Suwon-si (KR); THE UNIVERSITY OF CHICAGO, Chicago, IL (US); Center for Technology Licensing at Cornell University, Ithaca, NY (US)

(72) Inventors: Minhyun Lee, Suwon-si (KR); Jiwoong Park, Chicago, IL (US); Saien Xie, Ithaca, NY (US); Jinseong Heo, Seoul (KR); Hyeonjin Shin, Suwon-si (KR)

(73) Assignees: Samsung Electronics Co., Ltd., Gyeonggi-do (KR); Center for Technology Licensing at Cornell University, Ithaca, NY (US); The University of Chicago, Chicago, IL (US)

(*) Notice: Subject to any disclaimer, the term of this patent is extended or adjusted under 35 U.S.C. 154(b) by 28 days.

(21) Appl. No.: 16/428,006

(22) Filed: May 31, 2019

(65) Prior Publication Data
US 2019/0371892 A1 Dec. 5, 2019

Related U.S. Application Data

(60) Provisional application No. 62/679,085, filed on Jun. 1, 2018.

(51) Int. Cl.
*H01L 29/15* (2006.01)
*H01L 29/10* (2006.01)

(52) U.S. Cl.
CPC ........ *H01L 29/158* (2013.01); *H01L 29/1054* (2013.01)

(58) Field of Classification Search
CPC .......................... H01L 29/158; H01L 29/1054
See application file for complete search history.

(56) References Cited

U.S. PATENT DOCUMENTS

| | | | | | |
|---|---|---|---|---|---|
| 4,625,137 | A | * | 11/1986 | Tomono | ............... H01L 41/042 310/317 |
| 2004/0086802 | A1 | * | 5/2004 | Gibson | ............... B82Y 10/00 430/270.13 |

(Continued)

FOREIGN PATENT DOCUMENTS

| KR | 20120058622 A | 6/2012 |
|---|---|---|
| WO | WO-2006/130623 A2 | 12/2006 |

OTHER PUBLICATIONS

Z. Zhang et al., 'Robust epitaxial growth of two-dimensional heterostructures, multiheterostructures, and superlattices' *Science*, vol. 357, Issue 6353, Aug. 2017, pp. 788-792.

(Continued)

*Primary Examiner* — Peniel M Gumedzoe
(74) *Attorney, Agent, or Firm* — Harness, Dickey & Pierce, P.L.C.

(57) ABSTRACT

Provided are a superlattice structure including a two-dimensional material and a device including the superlattice structure. The superlattice structure may include at least two different two-dimensional (2D) materials bonded to each other in a lateral direction, and an interfacial region of the at least two 2D materials may be strained. The superlattice structure may have a bandgap adjusted by the interfacial region that is strained. The at least two 2D materials may include first and second 2D materials. The first 2D material may have a first bandgap in an intrinsic state thereof. The second 2D material may have a second bandgap in an (Continued)

intrinsic state thereof. An interfacial region of the first and second 2D materials and an adjacent region may have a third bandgap between the first bandgap and the second bandgap.

20 Claims, 22 Drawing Sheets

(56) References Cited

U.S. PATENT DOCUMENTS

2015/0122315 A1     5/2015   Shin et al.
2019/0273194 A1     9/2019   Nakamura et al.

OTHER PUBLICATIONS

J. Mann et al., '2-Dimensional Transition Metal Dichalcogenides with Tunable Direct Band Gaps: $MoS_2(1-X)Se_{2x}$ Monolayers' *Advanced Materials*, vol. 26, 2014, pp. 1399-1404.

K. Chen et al., 'Electronic Properties of MoS2-WS2 Heterostructures Synthesized with Two-Step Lateral Epitaxial Strategy' *ACS Nano*, vol. 9, No. 10, Sep. 2015, op. 9868-9876.

X. Duan et al., 'Lateral epitaxial growth of two-dimensional layered semiconductor heterojunctions' *Nature Nanotechnology*, vol. 9, Sep. 2014, pp. 1024-1030.

B. Radisavljevic et al., 'Single-layer MoS2 transistors' *Nature Nanotechnology*, vol. 6, Mar. 2011, pp. 147-150.

M.Y. Li et al., 'Epitaxial growth of a monolayer WSe2-MoS2 lateral p-n junction with an atomically sharp interface' *Science*, vol. 349, Issue 6247, Jul. 2015, pp. 524-528.

H. Heo et al., 'Rotation-Misfit-Free Heteroepitaxial Stacking and Stitching Growth of Hexagonal Transition-Metal Dichalcogenide Monolayers by Nucleation Kinetics Controls' *Advanced Materials*, vol. 27, 2015, pp. 3803-3810.

Saien Xie et al., 'Coherent, atomically thin transition-metal dichalcogenide superlattices with engineered strain' *Science*, vol. 359, Mar. 2018, pp. 1131-1136.

* cited by examiner 15 25 35 15

17 27 17 27

18 28 18 28

SUPERLATTICE STRUCTURE INCLUDING TWO-DIMENSIONAL MATERIAL AND DEVICE INCLUDING THE SUPERLATTICE STRUCTURE

CROSS-REFERENCE TO RELATED APPLICATION

This application claims the benefit of U.S. Provisional Application No. 62/679,085, filed on Jun. 1, 2018, in the United States Patent and Trademark Office, the disclosure of which is incorporated herein in its entirety by reference.

STATEMENT REGARDING FEDERALLY SPONSORED RESEARCH OR DEVELOPMENT

This invention was made with government support under FAA9550-16-0347 awarded by the Aft Force Office of Scientific Research, and by grants 1420709 and 1539918 awarded by the National Science Foundation. The government has certain rights in the invention.

BACKGROUND

1. Field

The present disclosure relates to superlattice structures including a two-dimensional material and devices including the superlattice structure.

2. Description of Related Art

A two-dimensional (2D) material is a single-layered or half-layered solid material in which atoms configure crystal structures, and a representative example of a 2D material may include graphene. Beginning with research on graphene, research and development have been conducted on various 2D materials having semiconductor or insulator properties. These 2D materials have been considered as next-generation materials that may overcome limitations on existing devices.

Recently, the research area has expanded to a technique of stacking different 2D materials. A vertical heterostructure, in which different kinds of 2D materials are stacked, may be formed easily by a layer-by-layer transfer process or a chemical vapor deposition (CVD) process, and thus, research has been actively conducted thereon. However, a lateral heterostructure, in which 2D materials are bonded in a horizontal direction, is difficult to manufacture, and there are various technical issues regarding the lateral heterostructure.

SUMMARY

Provided are lateral two-dimensional (2D) superlattice structures having excellent performance and physical properties that may be controlled.

Provided are lateral 2D superlattice structures, in which at least two 2D materials are bonded in a lateral direction.

Provided are lateral 2D superlattice structures having a bandgap adjusted by a strain.

Provided are devices including the lateral 2D superlattice structure.

Additional aspects will be set forth in part in the description which follows and, in part, will be apparent from the description, or may be learned by practice of the presented embodiments.

According to an aspect, a lateral two-dimensional (2D) superlattice structure includes at least two 2D materials that are different from each other and bonded to each other in a lateral direction. An interfacial region of the at least two 2D materials may be strained. The lateral 2D superlattice structure may have a bandgap adjusted by the interfacial region that is strained.

In some embodiments, the at least two 2D materials may include a first 2D material and a second 2D material. The first 2D material may have a first bandgap in an intrinsic state thereof. The second 2D material may have a second bandgap in an intrinsic state thereof. An interfacial region of the first 2D materials and the second 2D material and an adjacent region may have a third bandgap that is between the first bandgap and the second bandgap.

In some embodiments, the interfacial region may not include dislocations or may include 1% or less dislocations.

In some embodiments, the interfacial region of the at least two 2D material may include 2D materials having lattice mismatch of 10% or less, and may have 10% or less strain due to the lattice mismatch.

In some embodiments, the interfacial region may have a bandgap variation rate of 30% or less with respect to one of the at least two 2D materials.

In some embodiments, the at least two 2D materials may include at least two transition metal dichalcogenide (TMDC) materials that are different from each other.

In some embodiments, one or more of the at least two 2D materials may include a metal atom among Mo, W, Nb, V, Ta, Ti, Zr, Hf, Tc, Re, Cu, Ga, In, Sn, Ge, or Pb, and a chalcogenide atom among S, Se, or Te.

In some embodiments the lateral 2D superlattice structure may have a structure, in which two kinds of 2D materials are alternately and repeatedly arranged or three kinds of 2D materials are periodically arranged.

In some embodiments, lateral 2D superlattice structure may include two or more kinds of 2D materials that are arranged to have a uniform width, a uniform ratio, or both a uniform width and a uniform ratio.

In some embodiments, the lateral 2D superlattice structure may include two or more kinds of 2D materials that are arranged to have different widths according to locations thereof, different ratios from each other according to locations thereof, or both different widths and different ratios from each other according to locations thereof.

In some embodiments, the at least two 2D materials may include a first 2D material and a second 2D material. A first region of the lateral 2D superlattice structure may include the first 2D material and the second 2D material bonded to each other at a first ratio. A second region of the lateral 2D superlattice structure may include the first 2D material and the second 2D material are bonded to each other at a second ratio that is different from the first ratio. The first region may have a first adjusted bandgap and the second region may have a second adjusted bandgap. The second adjusted bandgap may be different from the first adjusted bandgap.

In some embodiments, the at least two 2D materials included in the lateral 2D superlattice structure may each have a width of 1000 nm or less.

In some embodiments, the lateral 2D superlattice structure may have a triangle shape or a square shape when seen from above.

In some embodiments, the lateral 2D superlattice structure may include a P—N—P bonding structure, an N—P—N bonding structure, a P+-P—P+ bonding structure, an N+-N—N+ bonding structure, or a combination thereof.

In some embodiments, the lateral 2D superlattice structure may include a plurality of regions having different bandgaps from one another.

According to another aspect, a two-dimensional (2D) material-containing device may include one of above-described the lateral 2D superlattice structures and at least one electrode member connected to the lateral 2D superlattice structure.

In some embodiments, the 2D material-containing device may include an electronic device.

In some embodiments, the 2D material-containing device may include an optical device.

In some embodiments, the 2D material-containing device may include at least one of a diode type device or a transistor type device.

In some embodiments, the 2D material-containing device may further include: a first electrode element connected to a first region of the lateral 2D superlattice structure; a second electrode element connected to a second region of the lateral 2D superlattice structure; and a connecting element between the lateral 2D superlattice structure and the second electrode element for connecting the lateral 2D superlattice structure to the second electrode element.

In some embodiments, the lateral 2D superlattice structure of the 2D material-containing device may include a plurality of first 2D material regions and a plurality of second 2D material regions that are alternately arranged. The 2D material-containing device may further include a first electrode structure connected to the plurality of first 2D material regions and a second electrode structure connected to the plurality of second 2D material regions.

In some embodiments, the 2D material-containing device may include a first gate structure and a second gate structure. The lateral 2D superlattice structure of the 2D material-containing device may include an N-channel region and a P-channel region. The first gate structure may be on the N-channel region and the second gate structure arranged on the P-channel region.

According to an aspect, a lateral 2D superlattice structure may include a first layer having a first 2D material and a second layer having a second 2D material. The second 2D material may be different than the first 2D material. The second layer may be bonded to the first layer in a lateral direction to define an interfacial region. The interfacial region may be strained due to a lattice mismatch between the first 2D material and the second 2D material. A band gap of the interfacial region may be between a bandgap of the first 2D material and a bandgap of the second 2D material.

In some embodiments, the lateral 2D superlattice structure may further include a plurality of first layers spaced apart from each other in the lateral direction, each having the first 2D material; and a plurality of second layers spaced apart from each other in the lateral direction, each having the second 2D material. The plurality of first layers may include the first layer and the plurality of second layers may include the second layer. The plurality of first layers and the plurality of second layers may be alternately or periodically arranged with each other and concentrically arranged with each other. The plurality of first layers and the plurality of second layers may have a same shape. The plurality of first layers and the plurality of second layers may be different sizes from each other.

In some embodiments, the lateral 2D superlattice structure may further include a third layer having a third 2D material. The third layer may be concentrically arranged between a corresponding first layer among the plurality of first layers and a corresponding second layer among the plurality of second layers. Opposite sides of the third layer may be laterally bonded to the corresponding first layer and the corresponding second layer. An interface between the third layer and the corresponding first layer may be a coherent epitaxial interface that may be strained due to a lattice mismatch between the third 2D material and the first material. An interface between the third layer and the corresponding second layer may be a coherent epitaxial interface that may be strained due to a lattice mismatch between the third 2D material and the first material.

In some embodiments, the first material may be a first transition metal dichalcogenide, the second material may be a second transition metal dichalcogenide that is different than the first transition metal dichalcogenide, and the interfacial region may include a coherent epitaxial interface between the first material and the second material.

In some embodiments, a two-dimensional (2D) material-containing device may include one of the above-discussed the lateral 2D superlattice structures.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
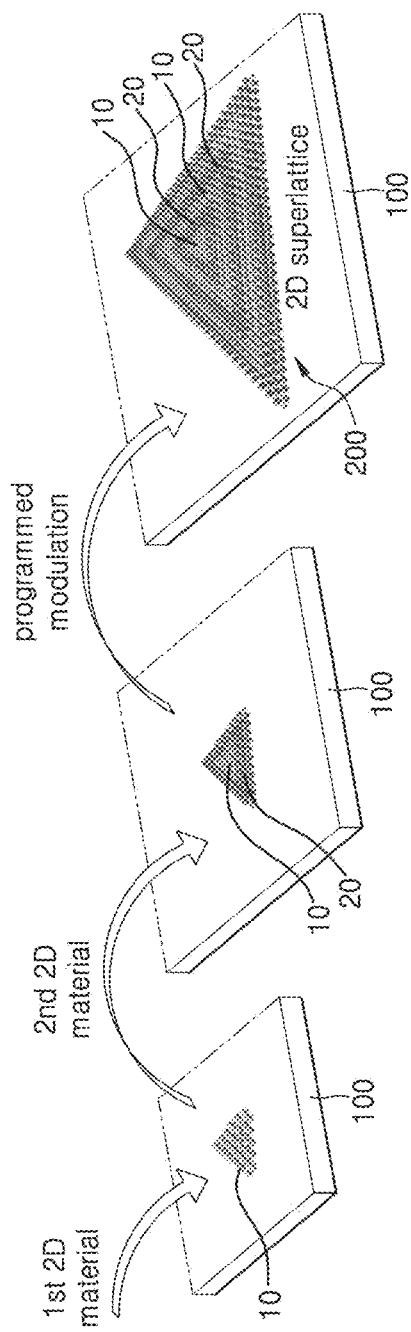
FIG. 1 is a perspective view showing processes of manufacturing a lateral two-dimensional (2D) superlattice structure according to an embodiment.

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

FIG. 1 is a perspective view showing processes of manufacturing a lateral two-dimensional (2D) superlattice structure according to an embodiment.

Referring to FIG. 1, a first 2D material 10 is on a substrate 100, and a second 2D material 20 may be bonded to side surfaces of the first 2D material. The first 2D material 10 and the second 2D material 20 may be separate layers. By repeatedly performing the above process, a lateral 2D superlattice structure 200 may be obtained. The lateral 2D superlattice structure 200 may have a coherent heterostructure and may be a 2D thin film that is atomically thin. A superlattice structure has a structure, in which two or more material layers are periodically arranged. The coherent heterostructure may have a coherent heterointerface. The coherent heterointerface denotes a case in which atoms of two materials are matched/bonded with one another with little or no point defect or line defect (dislocation). On the other hand, an incoherent heterointerface or incoherent heterostructure denotes a case in which atoms of two materials are incoherent at an interface due to formation of the dislocation. In the embodiment, at least two different 2D materials are bonded in a lateral direction to form a coherent heterostructure, and thus, an interfacial region of the at least two 2D materials may be strained and may have a bandgap that is adjusted by the strained interfacial region.

The first and second 2D materials 10 and 20 may be, for example, different transition metal dichalcogenides (TMDC). In this case, at least one of the first and second 2D materials 10 and 20 may include one transition metal selected from Mo, W, Nb, V, Ta, Ti, Zr, Hf, Tc, and Re, and one chalcogen atom selected from S, Se, and Te. The TMDC may be expressed as, for example, $MX_2$, where M denotes a transition metal and X denotes a chalcogen atom. M may include any one of Mo, W, Nb, V, Ta, Ti, Zr, Hf, Tc, Re, etc., and X may include any one of S, Se, and Te. The TMDC may include, for example, any one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. However, the first and second 2D materials 10 and 20 may include other 2D materials than TMDC. For example, the first and second 2D materials 10 and 20 may include chalcogenide materials including non-transition metal. The non-transition metal may include, for example, any one of Ga, In, Sn, Ge, Pb, etc. That is, a compound of the non-transition metal such as any one of Ga, In, Sn, Ge, Pb, etc. and the chalcogenide atom such as S, Se, and Te may be used as the first and second 2D materials 10 and 20. The chalcogenide material including the non-transition metal may include, for example, any one of $SnSe_2$, GaS, GaSe, GaTe, GeSe, $In_2Se_3$, $InSnS_2$, etc. Therefore, at least one of the first and second 2D materials 10 and 20 may include one metal atom selected from Mo, W, Nb, V, Ta, Ti, Zr, Hf, Tc, Re, Cu, Ga, In, Sn, Ge, and Pb and one chalcogenide atom selected from S, Se, and Te. However, materials (atoms) suggested herein are examples, and other materials (atoms) may be used.

The lateral 2D superlattice structure 200 may be formed by a modulated chemical vapor deposition (CVD) process. The modulated CVD process may be a modulated metal-organic CVD (MOCVD) process. In this case, source materials (precursor materials) of the first and second 2D materials 10 and 20 are alternately injected into a reaction chamber, and concentration and injection time thereof may be independently and precisely controlled. For example, a first chalcogen precursor for the first 2D material 10 and a second chalcogen precursor for the second 2D material 20 may be alternately injected while constantly injecting a desired (and/or alternatively predetermined) metal precursor material into the reaction chamber. Here, a time period for injecting the first chalcogen precursor and a time period for injecting the second chalcogen precursor may be controlled. When the first 2D material 10 is $WS_2$ and the second 2D material 20 is $WSe_2$, $WS_2$ and $WSe_2$ may grow in proportion to growth time (reaction time) thereof, but $WS_2$ may grow two times faster than $WSe_2$ with respect to the same growth time (reaction time). In addition, a flow rate of the precursor, an injection amount of a carrier gas, a reaction temperature, and pressure may be controlled. For example, during a synthesis of the lateral 2D superlattice structure 200, a growth environment may be constantly maintained regardless of a specific TMDC composition. When the first 2D material 10 includes a first TMDC and the second 2D material 20 includes a second TMDC that is different from the first TMDC, during the formation of the first and second TMDCs, a temperature, a pressure, an overall flow rate, etc. may be constantly maintained except for a difference of the chalcogen precursors. According to an embodiment, each of the first and second 2D materials 10 and 20 may grow at a relatively slow growth rate that is close to a thermodynamic equilibrium. For example, the growth rate may be about 20 nm/min to about 60 nm/min. As such, the interface between the first and second 2D materials 10 and 20 may have a straight heterointerface having W-zigzag edges that are generally stabilized. A dimension (width) of each first 2D material 10 and a dimension (width) of each second 2D material 20 may be controlled by optimizing processing conditions and precisely controlling the processing conditions, and thus, generation of dislocation between the first and second 2D materials may be prevented or restrained (e.g., minimized).

Figure 2:
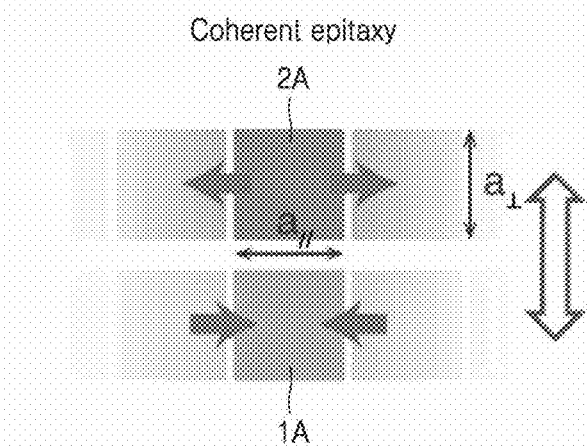
FIG. 2 is a conceptual diagram illustrating coherent epitaxy, according to an embodiment.

FIG. 2 is a conceptual diagram (plan view) for illustrating coherent epitaxy, according to an embodiment.

FIG. 2 shows a concept of the coherent epitaxy. A first 2D material 1A and a second 2D material 2A may be bonded to each other to form a coherent heterointerface. As such, for example, a coherent monolayer TMDC superlattice structure may be obtained. The coherent monolayer TMDC superlattice structure may entirely have a crystallized structure. An interfacial region between the first 2D material 1A and the second 2D material 2A may not include dislocation or may include dislocation by about 1% or less. Here, % may denote atomic %. The dislocations may exist or may not substantially exist within about 1% of atoms at the interfacial region. Also, the interfacial region may have a point defect, little or no other defect. By forming the coherent heterointerface as described above, the interfacial region between the first and second 2D materials 1A and 2A and peripheral first and second 2D materials 1A and 2A are strained, and thus, may have an adjusted bandgap. In an intrinsic state of the first 2D material 1A and an intrinsic state of the second 2D material 2A, lattice mismatch thereof may be within about 10% or about 5%. Since they are coherently bonded, strain of about 10% or about 5% or less may be caused due to the lattice mismatch at the interfacial region thereof. When the first 2D material 1A has a first bandgap in the intrinsic state thereof and the second 2D material 2A has a second bandgap in the intrinsic state thereof, the interfacial region therebetween and the peripheral region may have a third bandgap that is between the first bandgap and the second bandgap. The interfacial region may have a bandgap variation rate of about 30% or less with respect to one of the two 2D materials 1A and 2A. In FIG. 2, $a_{//}$ denotes a lattice constant in a direction parallel with the heterointerface and $a_{\perp}$ denotes a lattice constant in a direction perpendicular to the heterointerface.

Figure 3:
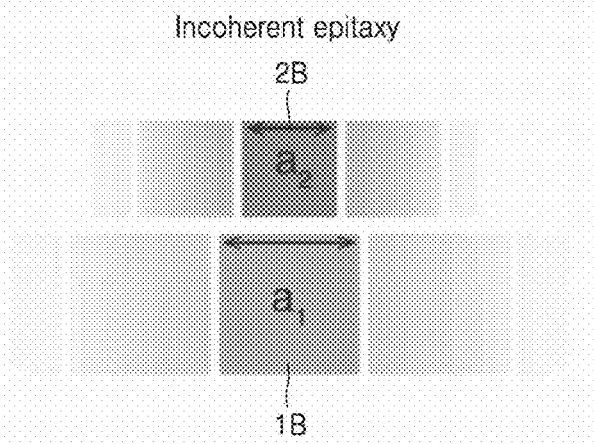
FIG. 3 is a conceptual diagram illustrating incoherent epitaxy, according to a comparative example.

FIG. 3 is a conceptual diagram (plan view) for illustrating incoherent epitaxy, according to a comparative example.

FIG. 3 shows a concept of the incoherent epitaxy. A first 2D material 1B and a second 2D material 2B may form an incoherent heterointerface. Due to the lattice mismatch between two different kinds of 2D materials 1B and 2B, point defects and line defects (dislocation) are generated on the interface thereof and a strain is not substantially caused. Also, the first 2D material 1B exhibits optical characteristics that come from an intrinsic bandgap thereof, and the second 2D material 2B exhibits optical characteristics that come from an intrinsic bandgap thereof. The optical characteristics of the two 2D materials 1B and 2B overlap each other on the interfacial region thereof. That is, independent physical property is shown in a region of each of the 2D materials 1B and 2B, and overlapped physical properties are shown in the interfacial region. Therefore, a bandgap tuning effect may not be obtained. In FIG. 3, $a_1$ and $a_2$ respectively denote lattice constants in a direction parallel with the heterointerface of the first 2D material 1B and the second 2D material 2B.

Figure 4:
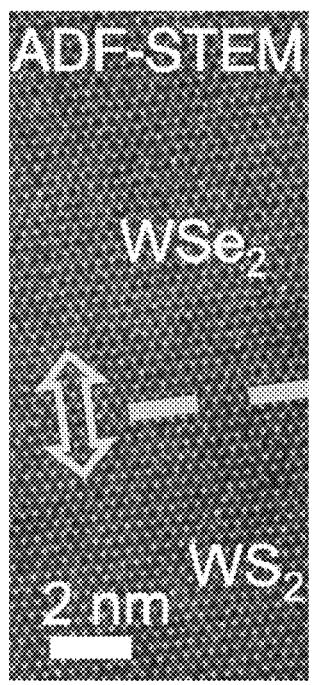
FIG. 4 is an annular dark-field scanning transmission electron microscope (ADF-STEM) image of a hetero interface and a peripheral area, according to an embodiment.

FIG. 4 is an annular dark-field scanning transmission electron microscope (ADF-STEM) image of a heterointerface (dashed line) and a peripheral area, according to an embodiment. The superlattice structure of FIG. 4 has a $WS_2/WSe_2$ bonding structure.

Referring to FIG. 4, the superlattice structure may maintain the lattice coherence throughout the entire region, and may not substantially include a misfit dislocation. An arrow in FIG. 4 denotes an epitaxy direction, which is also applied to FIGS. 5 to 8.

Figure 5:
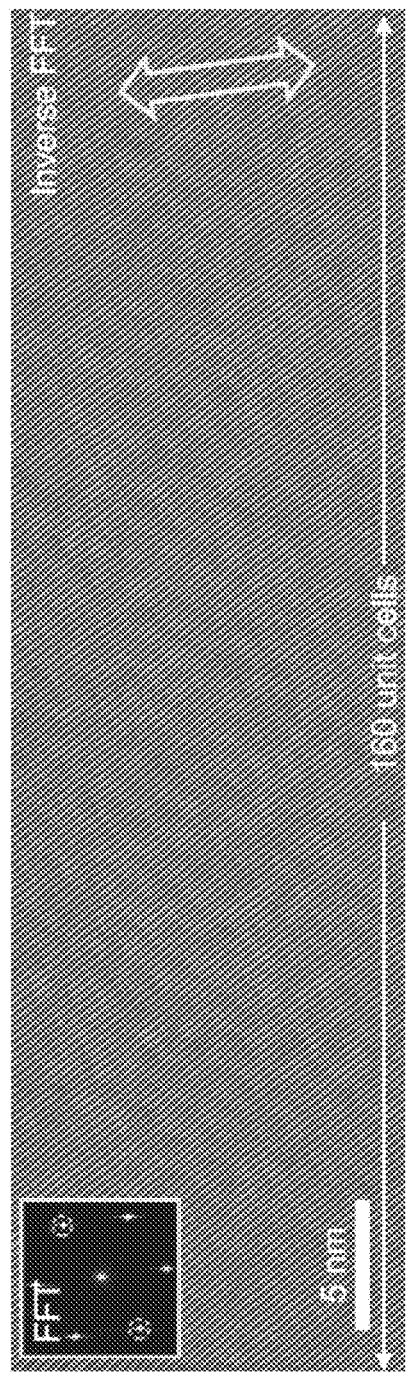
FIG. 5 shows inverse fast Fourier transformation (FFT) data of the ADF-STEM image obtained from a wide region around the heterointerface of the superlattice structure formed according to an embodiment.

FIG. 5 shows inverse fast Fourier transformation (FFT) data of the ADF-STEM image obtained from a wide region around the heterointerface of the superlattice structure formed according to an embodiment. An inserted view at an upper left side of FIG. 5 shows spots of the FFT, and the data is obtained based on circled spots.

Referring to FIG. 5, it may be identified that atoms form continuous lines without a misfit dislocation around the heterointerface over a large area.

Figure 6:
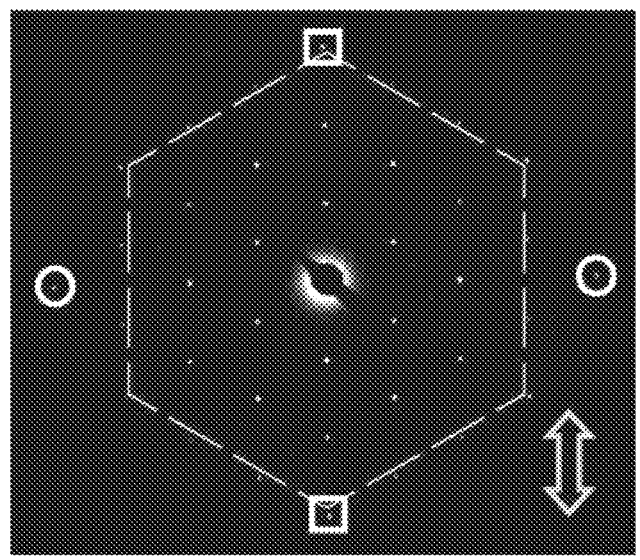
FIG. 6 is a diagram showing a selective-area electron diffraction (SAED) pattern obtained from the superlattice structure formed according to an embodiment.

FIG. 6 shows a selective-area electron diffraction (SAED) pattern obtained from the superlattice structure formed according to an embodiment. The data is obtained from a region having a diameter of 280 nm.

Referring to FIG. 6, a single-crystal-like that is sharp and has isotropic diffraction spots is shown.

Figure 7:
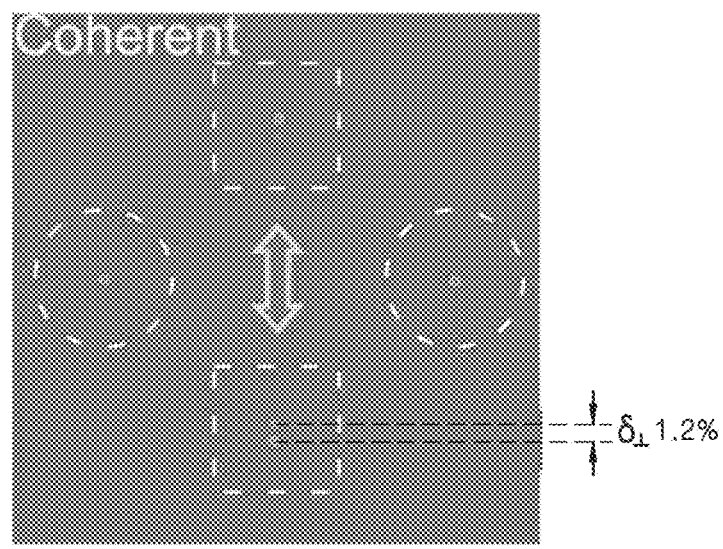
FIG. 7 is an enlarged view showing some diffraction spots of FIG. 6, and is obtained as a result of the coherent heterostructure according to an embodiment.

FIG. 7 is an enlarged view showing some diffraction spots of FIG. 6, and is obtained as a result of the coherent heterostructure according to an embodiment. FIG. 7 shows an enlarged view of spots in circles and squares of FIG. 6.

Referring to FIG. 7, diffraction data (in circles) corresponding to the direction in parallel with the heterointerface shows a single diffraction spot without separation. This denotes that a complete lattice matching is made in the direction parallel with the heterointerface. That is, it may denote $\delta_{//}=0$. The diffraction data (in squares) corresponding to a direction perpendicular to the heterointerface shows similar lattice constants. Although two spots, that is, spots respectively induced from $WS_2$ and $WSe_2$, the mismatch $(\delta_{\perp})$ was very small, that is, 1.2%. This is very small compared with the lattice mismatch between the two materials, that is, about 4%.

Figure 8:
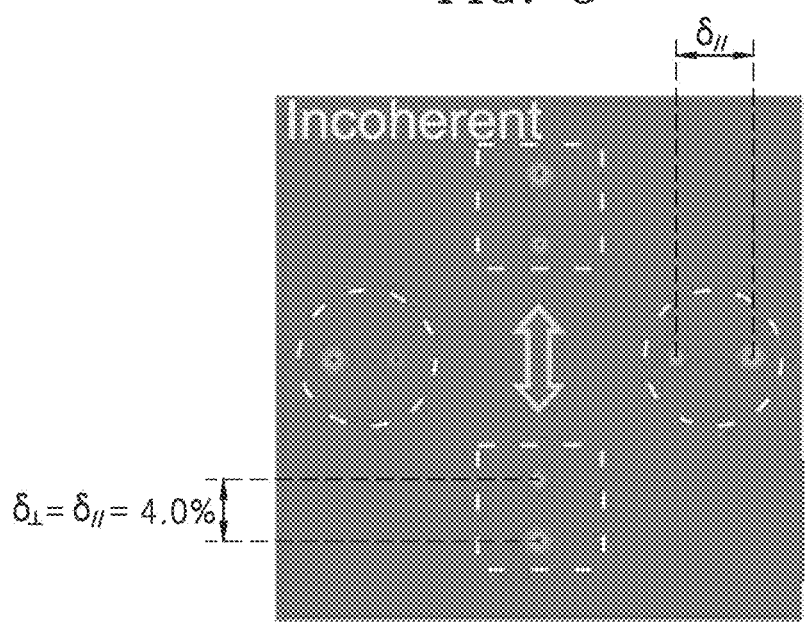
FIG. 8 is a diagram showing diffraction spots in an incoherent heterostructure, according to a comparative example.

FIG. 8 shows diffraction spots in an incoherent heterostructure, according to a comparative example. Measurement conditions of FIG. 8 are the same as those of FIG. 7. Results shown in FIG. 8 are obtained from the incoherent $WS_2/WSe_2$ heterostructure.

Referring to FIG. 8, there was found lattice mismatch of about 4% in the direction parallel with and the direction perpendicular to the heterointerface.

Figure 9:
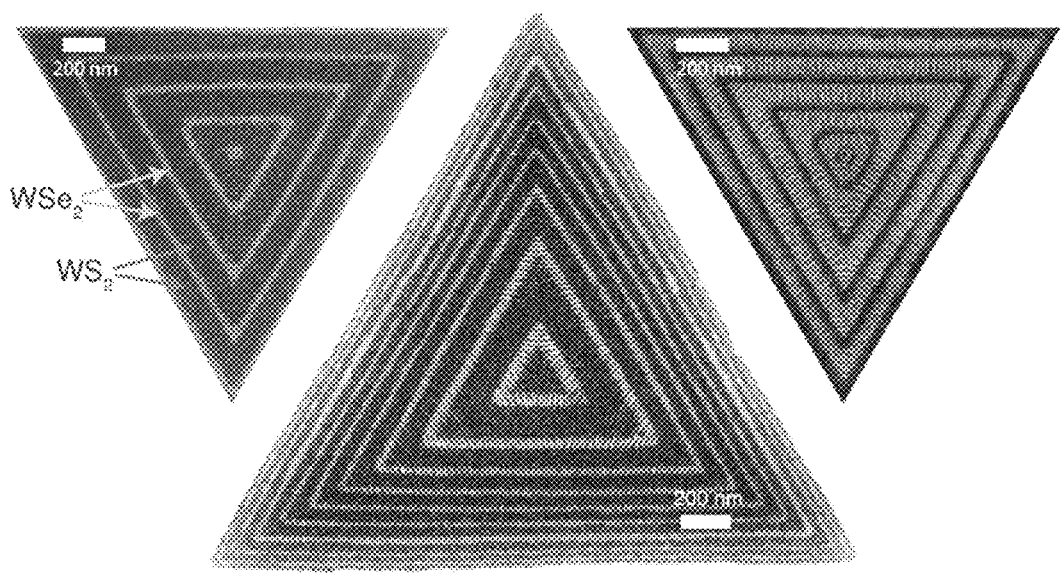
FIG. 9 is a scanning electron microscope (SEM) image showing lateral 2D superlattice structures formed according to one or more embodiments.

FIG. 9 is a scanning electron microscope (SEM) image showing lateral 2D superlattice structures formed according to one or more embodiments.

Referring to FIG. 9, monolayer $WS_2/WSe_2$ superlattice structures are shown. Here, regions that are relatively dark denote $WS_2$ and region that are relatively bright denote $WSe_2$. According to forming conditions, a width of each of 2D material regions may be controlled. The width of each of 2D materials forming the superlattice structure may be about 1000 nm or less. A triangle unit of each of $WS_2$ and $WSe_2$ may have an equilateral triangle shape having a high symmetric property and even width. As the coherent heterointerface is formed, the symmetricity and uniformity of each triangle unit may be greatly improved.

FIG. 9 illustrates the $WS_2/WSe_2$ superlattice structure as an example, but the materials may vary. For example, in some embodiments, $MoS_2$ may be further formed between $WSe_2$ and $WS_2$, and the materials may variously change. The lateral 2D superlattice structure according to an embodiment may have a structure, in which two kinds of 2D materials are alternately and repeatedly arranged or three or more 2D materials are periodically arranged.

According to embodiments, an induced strain may vary depending on widths and/or a ratio between two or more kinds of 2D materials configuring the lateral 2D superlattice structure, and accordingly, a bandgap tuning effect may also change.

Figure 10:
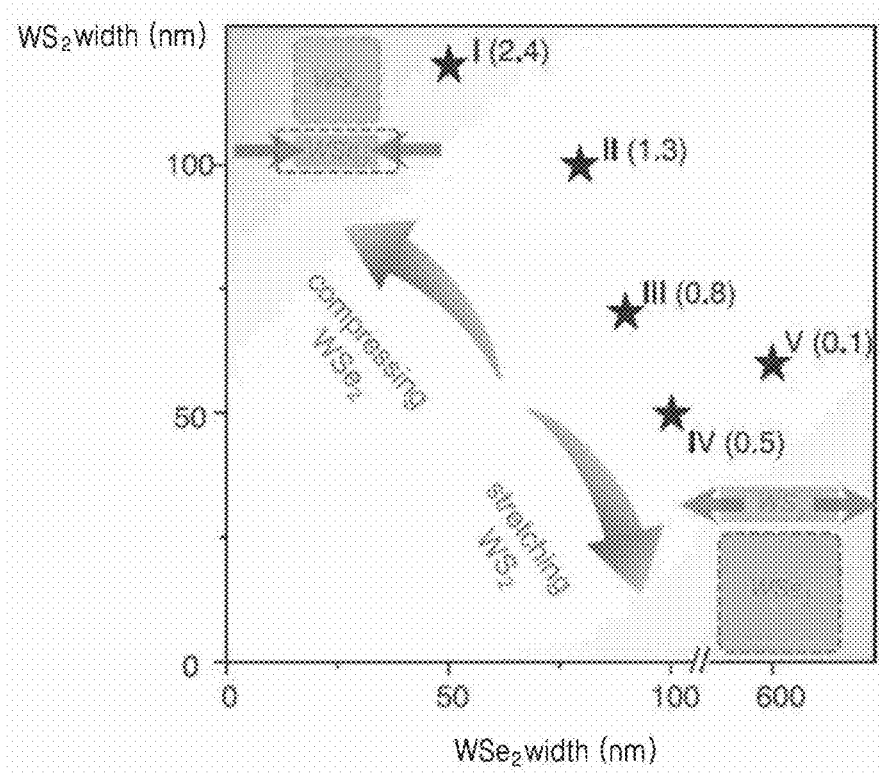
FIG. 10 is a graph illustrating superlattice structures having different ratios between materials from one another, according to the embodiment.

FIG. 10 is a graph illustrating superlattice structures having different ratios between materials from one another, according to an embodiment.

Referring to FIG. 10, $WS_2/WSe_2$ superlattice structures I to V were formed while varying a width of $WS_2$ (a width in a direction perpendicular to the interface) and a width of $WSe_2$ (a width perpendicular to the interface). Here, numerical values in parentheses denote a ratio ($\rho$) between the width of $WS_2$ ($d_{WS2}$) and the width of $WSe_2$ ($d_{WSe2}$), that is, $d_{WS2}/d_{WSe2}$. As $d_{WSe2}$ decreases or $d_{WSe2}$ increases, that is, as the ratio ($\rho$) decreases, a tensile strain increases in $WS_2$ and a compressive strain may decrease in $WSe_2$, and the lattice constant in the horizontal direction and the lattice constant in the vertical direction with respect to $WS_2$ may be closer to intrinsic values. Additionally, band structures of both $WS_2$ and $WSe_2$ may be adjusted by the applied strain, and a size of a direct bandgap may be reduced due to the tensile strain and may be increased due to the compressive strain. The band structure depending upon the strain may allow a broad tuning of optical characteristics to be possible by the superlattice design.

Figure 11:
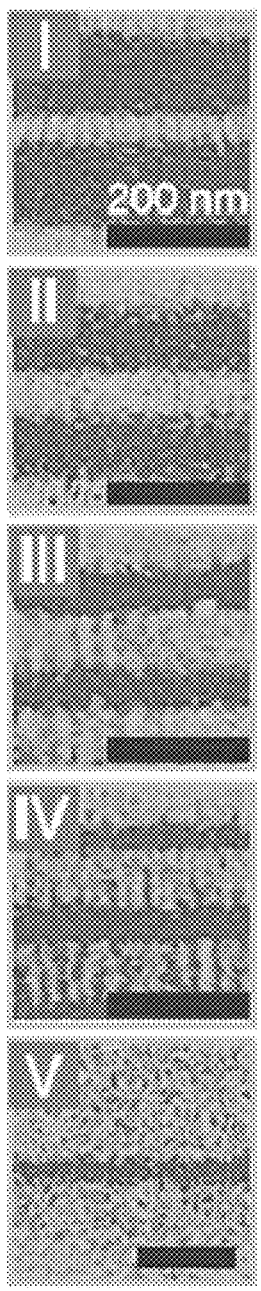
FIG. 11 shows a false-color SEM image with respect to superlattice structures I to V of FIG. 10.

FIG. 11 shows a false-color SEM image with respect to the superlattice structures I to V of FIG. 10.

Referring to FIG. 11, in the superlattice structures I to V, dark (e.g., blue) color represents $WS_2$ and light (e.g., yellow) color represents $WSe_2$. The superlattice structures I to V are coherent heterostructures and have different ratio ($\rho$) of materials from one another (see FIG. 10).

Figure 12:
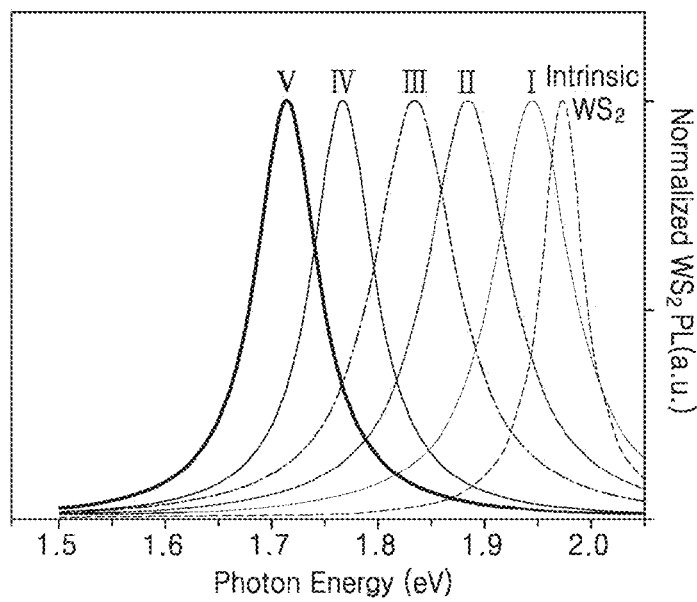
FIG. 12 is a graph showing normalized photoluminescence (PL) spectra with respect to $WS_2$ in the superlattice structures I to V of FIG. 11.

FIG. 12 is a graph showing normalized photoluminescence (PL) spectra with respect to $WS_2$ in the superlattice structures I to V of FIG. 11. Also, FIG. 12 also shows normalized PL spectrum with respect to intrinsic $WS_2$.

Referring to FIG. 12, the normalized $WS_2$ peak shifts to a left side from the structure I towards the structure V. As the ratio ($\rho$) between the materials decreases, the normalized $WS_2$ peak may be away from the intrinsic $WS_2$ peak. The normalized $WS_2$ peak may correspond to the bandgap.

Figure 13:
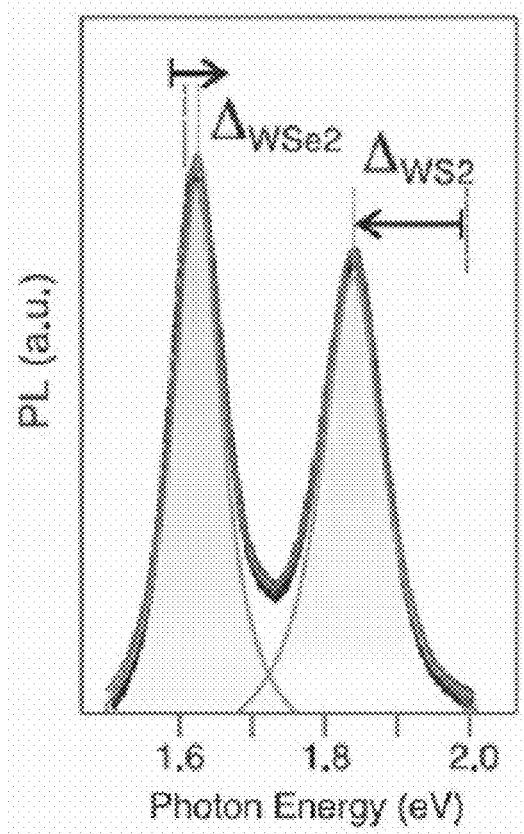
FIG. 13 is a graph showing a representative PL spectrum of $WS_2/WSe_2$ superlattice structure according to the embodiment.

FIG. 13 is a graph showing a representative PL spectrum of the $WS_2/WSe_2$ superlattice structure according to an embodiment.

Referring to FIG. 13, the $WS_2$ peak may be shifted from 1.97 eV, that is, the intrinsic peak energy, to a left side by $\Delta_{WS2}$ (that is, red-shifted), and the $WSe_2$ peak may be shifted from 1.61 eV, that is, the intrinsic peak energy, to a right side by $\Delta_{WSe2}$ (that is, blue-shifted). Therefore, $WS_2$ and $WSe_2$ regions may have adjusted bandgaps.

Figure 14:
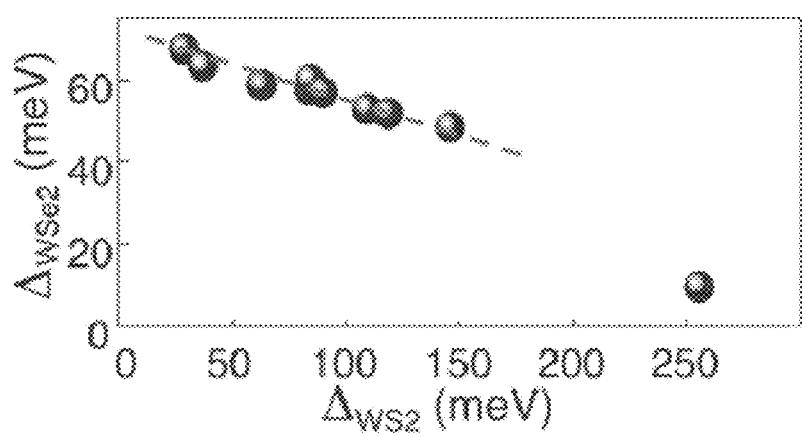
FIG. 14 is a graph showing $\Delta_{WS2}$ versus $\Delta W_{Se2}$ with respect to $WS_2/WSe_2$ superlattice structures having different material ratio (width ratio) from one another.

FIG. 14 is a graph showing $\Delta_{WS2}$ versus $\Delta_{WSe2}$ with respect to $WS_2/WSe_2$ superlattice structures having different material ratio (width ratio) from one another.

Referring to FIG. 14, $\Delta_{WSe2}$ tends to decrease as $\Delta_{WS2}$ increases. When $\Delta_{WS2}$ and $\Delta_{WSe2}$ both have positive values, it denotes that $WS_2$ is subjected to tensile deformation and $WSe_2$ is subjected to compressive deformation.

Figure 15A:
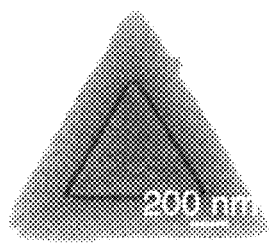
FIG. 15A is a SEM image showing a case in which a narrow $WS_2$ stripe is embedded in $WSe_2$ and FIG. 15B is a PL image showing a heterostructure of FIG. 15A.
Figure 15B:
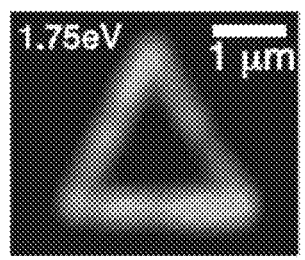

FIG. 15A is a SEM image showing a case in which a narrow $WS_2$ stripe is embedded in $WSe_2$ and FIG. 15B is a PL image showing a heterostructure of FIG. 15A. The PL image of FIG. 15B is obtained from photon energy of 1.75 eV.

Referring to FIGS. 15A and 15B, it may be identified that a highly red-shifted $WS_2$ PL peak is generated from a strained $WS_2$ region.

Figure 16A:
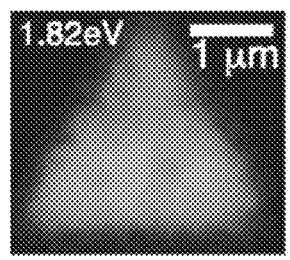
FIGS. 16A and 16B are PL images of $WS_2/WSe_2$ superlattice structures.
Figure 16B:
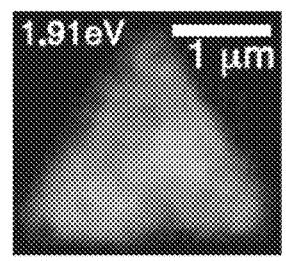
Figure 16C:
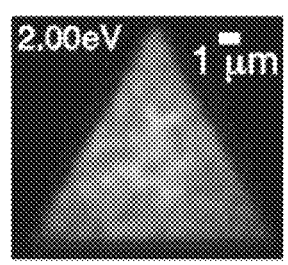
FIG. 16C is a PL image of an intrinsic monolayer $WS_2$.

FIGS. 16A and 16B are PL images of $WS_2/WSe_2$ superlattice structures, and FIG. 16C is a PL image of an intrinsic monolayer $WS_2$. FIGS. 16A and 16B are obtained from photon energy close to the $WS_2$ of the corresponding superlattice structures, that is, FIG. 16A is obtained at 1.82 eV and FIG. 16B is obtained at 1.91 eV. FIG. 16C is obtained at photon energy of 2.00 eV.

Referring to FIG. 16, the superlattice structures of FIGS. 16A and 16B each have a supercell dimension smaller than a diffraction limit, and in this case, the superlattice structures show uniform PL intensity at each peak throughout the entire structure, similarly to the intrinsic $WS_2$ of FIG. 16C. Here, the supercell denotes a pair of 2D materials bonded to each other.

Strong epitaxial strains may be precisely engineered by the supercell dimension of nano-scale. The superlattice structure having engineered strain may be obtained by the superlattice design. Physical properties of the superlattice structure may be precisely controlled due to the engineered strain. In some cases, the superlattice structure according to embodiments may exhibit characteristics of a new material, rather than independent characteristics of a plurality of 2D materials. In other words, the bandgap tuning characteristics may be implemented in entire 2D superlattice structure. The 2D superlattice structure having a desired bandgap may be formed by using a plurality of different 2D materials. Also, by suppressing occurrence of defect at the interface, a high level of electrical characteristics may be ensured.

According to an embodiment, the first 2D material forming the superlattice structure may have a first bandgap in an intrinsic state thereof, the second 2D material may have a second bandgap in an intrinsic state thereof, the first 2D material region adjacent to an interface between the first and second 2D materials may have a third bandgap, and the second 2D material region adjacent to the interface may have a fourth bandgap. Here, the third and fourth bandgaps may exist between the first bandgap and the second bandgap. When a size of the supercell included in the superlattice structure is small, e.g., tens of nm, the superlattice structure may entirely have an adjusted bandgap.

Figure 17:
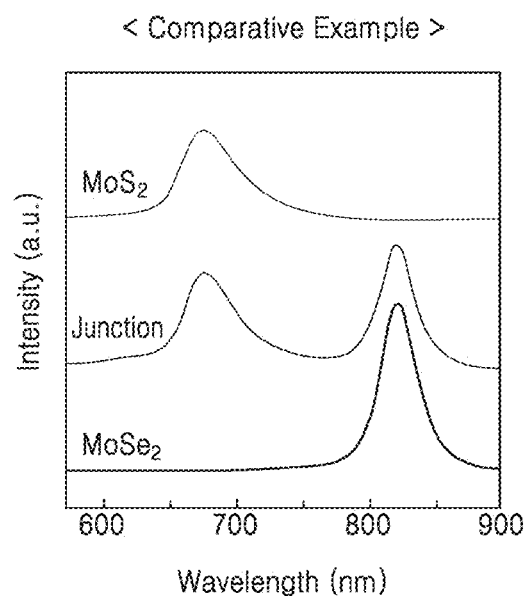
FIG. 17 is a graph showing a PL spectrum of a heterostructure according to a comparative example.

FIG. 17 is a graph showing a PL spectrum of a heterostructure according to a comparative example. The heterostructure according to the comparative example has a $MoS_2/MoSe_2$ structure, and an interface is an incoherent heterointerface.

Referring to FIG. 17, intrinsic characteristics of $MoS_2$ are shown in the $MoS_2$ region, intrinsic characteristics of $MoSe_2$ are shown in the $MoSe_2$ region, and characteristics of $MoS_2$ and $MoSe_2$ are shown together in the bonded portion (interface) thereof. In this structure, the physical properties of each material are independently shown in each material region, and the bandgap tuning effect is not obtained.

Figure 18:
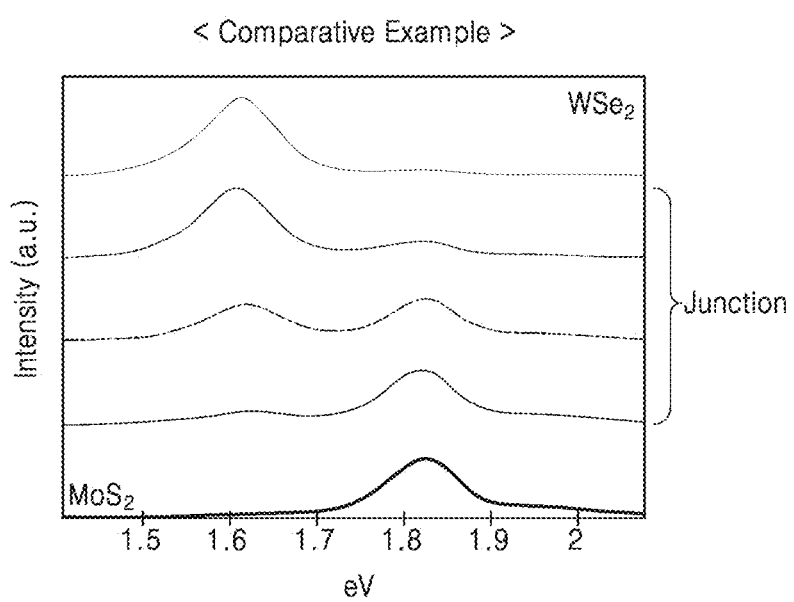
FIG. 18 is a graph showing a PL spectrum of a heterostructure according to a comparative example.

FIG. 18 is a graph showing a PL spectrum of a heterostructure according to a comparative example. The heterostructure according to the comparative example has a $WSe_2/MoS_2$ structure, and an interface is an incoherent heterointerface.

Referring to FIG. 18, intrinsic characteristics of $WSe_2$ are shown in the $WSe_2$ region, intrinsic characteristics of $MoS_2$ are shown in the $MoS_2$ region, and characteristics of $MoS_2$ and $WSe_2$ are independently shown or shown together in the bonded portion (interface) thereof. In this structure, the bandgap tuning effect is not obtained.

The lateral 2D superlattice structure according to one or more embodiments may have a structure, in which two or more kinds of 2D materials are alternately (periodically) arranged. Here, the two or more kinds 2D materials may be arranged to have the same width and/or the same ratio, or may be arranged to have different widths and/or different ratios according to locations thereof. In latter case, during the formation of the lateral 2D superlattice structure, the width and the ratio between the 2D materials may be gradually modulated. The lateral 2D superlattice structure may include a first region in which the first and second 2D materials are bonded with a first ratio and a second ratio in which the first and second 2D materials are bonded with a second ratio that is different from the first ratio. The first region may have a first modulated bandgap and the second region may have a second modulated bandgap that is different from the first modulated bandgap. The lateral 2D superlattice structure according to one or more embodiments may have a triangle or a square shape when it is seen from above, may include at least one bonding structure selected from P—N, P—N—P, N—P—N, $P^+$—P—$P^+$, and $N^+$—N—$N^+$, and may include a plurality of regions having different bandgaps from one another.

FIGS. 19 to 23 are plan views of lateral 2D superlattice structures according to one or more embodiments.

Figure 19:
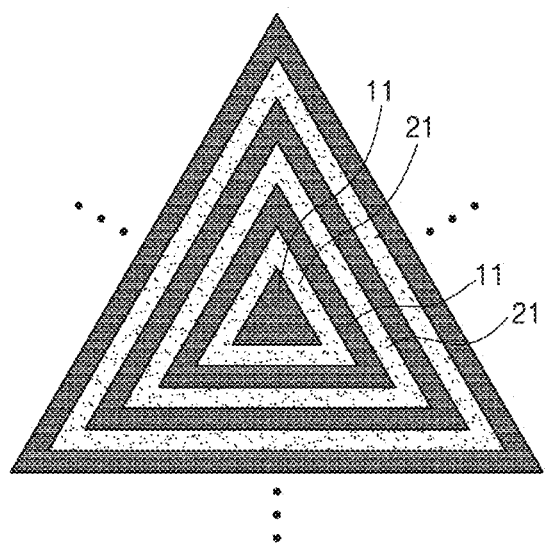
FIGS. 19 to 23 are plan views of lateral 2D superlattice structures according to one or more embodiments.
Figure 20:
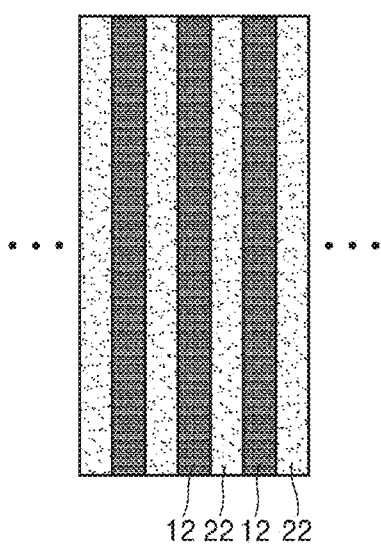
Figure 21:
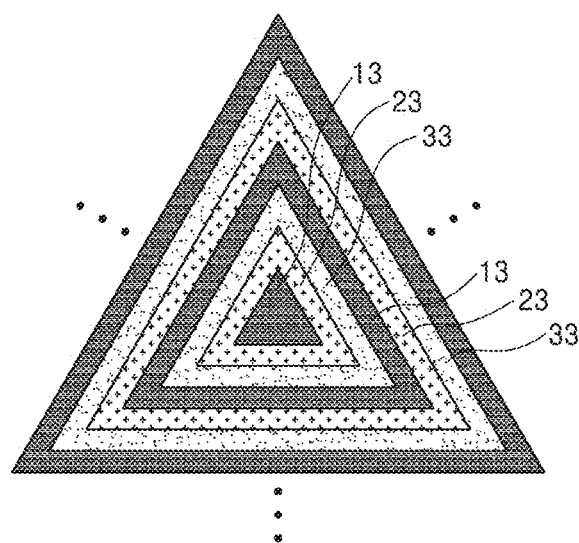
Figure 22:
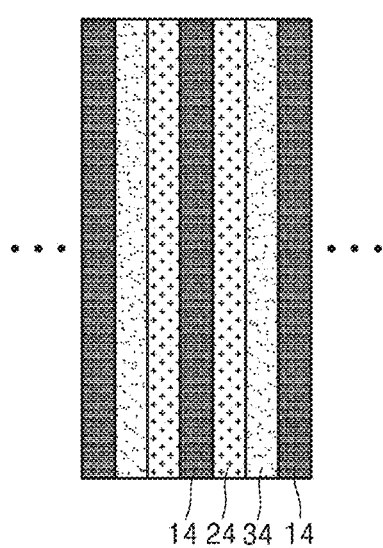
Figure 23:
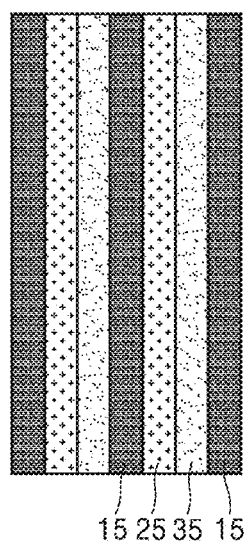

In the embodiments of FIGS. 19 to 23, the 2D materials may be formed with substantially the same widths and/or substantially the same ratio. In FIGS. 19 and 20, two kinds of 2D materials 11/21 or 12/22 are alternately arranged, and FIGS. 21 to 23, three kinds of 2D materials 13/23/33, 14/24/34, or 15/25/35 are periodically arranged. The 2D materials 11/21 in FIG. 19, 2D materials 12/22 in FIG. 20, 2D materials 13/23/33 in FIG. 22, 2D materials 14/24/34 in FIG. 22, and 2D materials 15/25/35 in FIG. 23 may be in separate layers, respectively.

Figure 24:
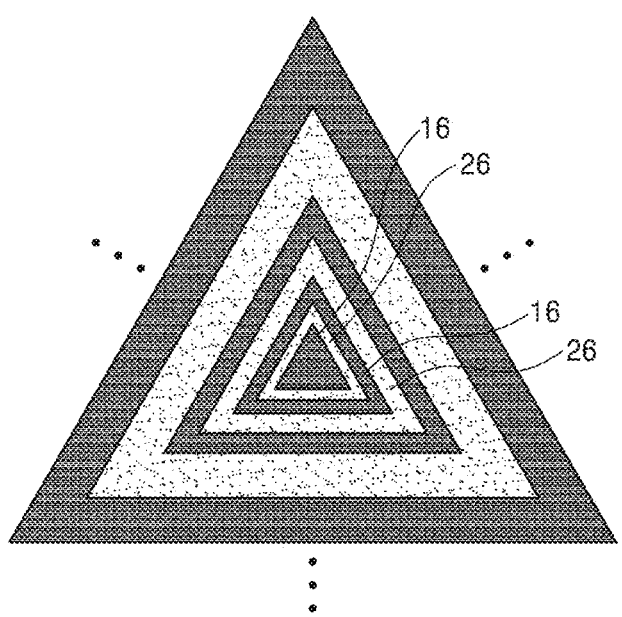
FIGS. 24 to 26 are plan views of lateral 2D superlattice structures according to another embodiment.
Figure 25:
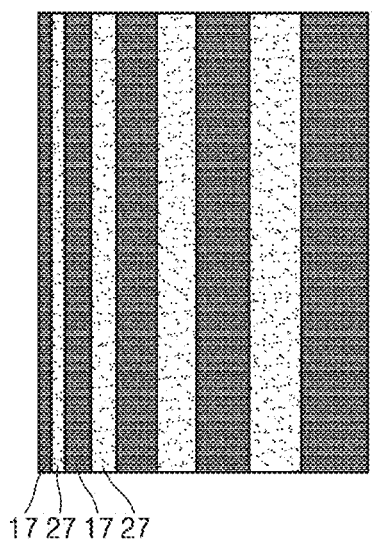
Figure 26:
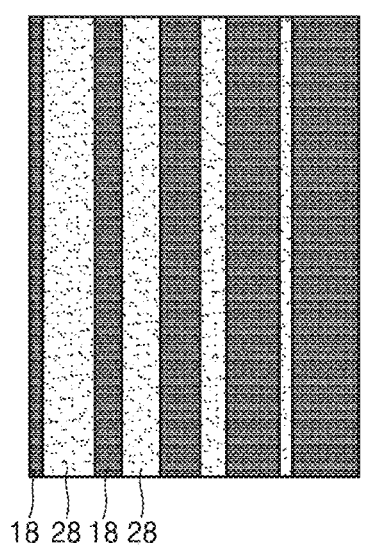

FIGS. 24 to 26 are plan views of lateral 2D superlattice structures according to another embodiment.

In the embodiments of FIGS. 24 to 26, 2D materials may be formed with different widths and/or different ratio according to locations thereof. In FIGS. 24 to 26, two kinds of 2D materials 16/26, 17/27, or 18/28 are alternately arranged, and a width of each 2D material may gradually increase or decrease. Although not shown in the drawings, three or more kinds of 2D materials may be arranged while varying widths thereof. The 2D materials 16/26 in FIG. 24, 2D materials 17/27 in FIG. 25, and 2D materials 18/28 in FIG. 26 may be in separate layers, respectively.

The lateral 2D superlattice structure according to embodiments may be effectively applied to various electronic devices and optical devices. A 2D material-containing device according to an embodiment may include the lateral 2D superlattice structure described above and at least one electrode member connected to the lateral 2D superlattice structure. Also, the 2D material-containing device may include at least one of a diode type device and a transistor type device. Hereinafter, the 2D material-containing device according to an embodiment will be described below with reference to FIGS. 27 to 29.

Figure 27A:
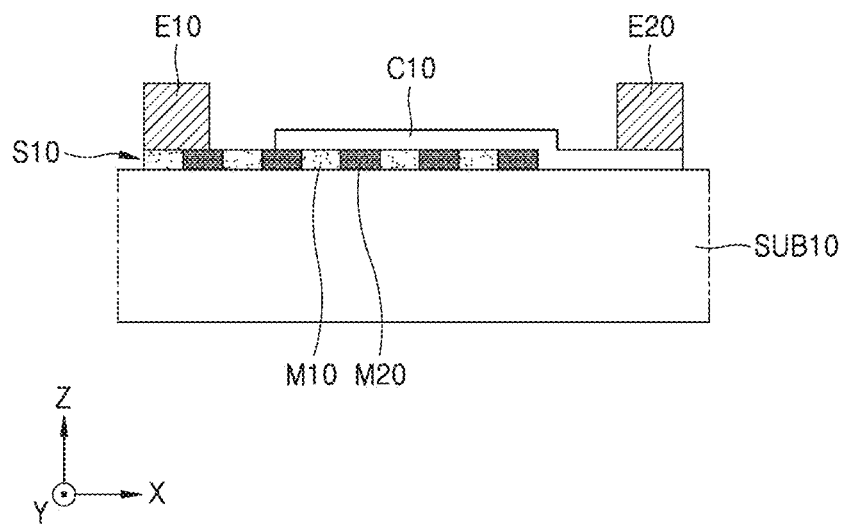
FIGS. 27A and 27B are respectively a cross-sectional view and a plan view of a 2D material-containing device according to an embodiment.
Figure 27B:
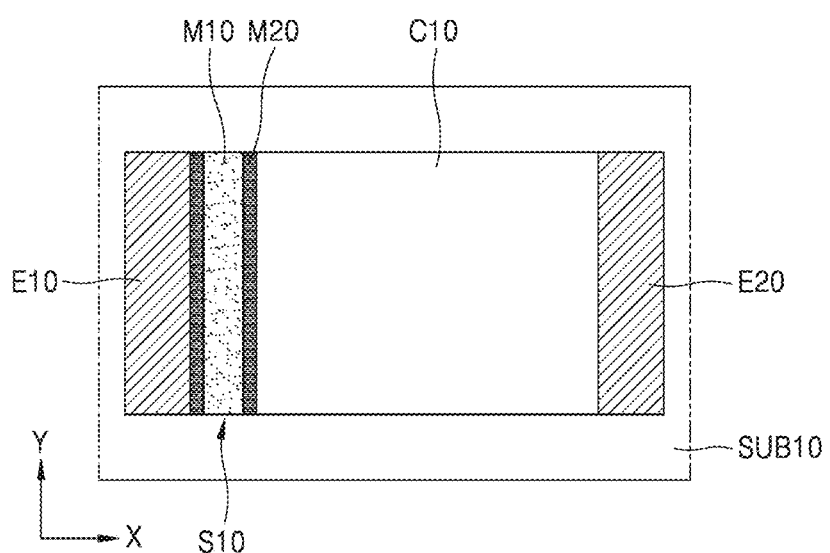

FIGS. 27A and 27B are respectively a cross-sectional view and a plan view of a 2D material-containing device according to an embodiment.

Referring to FIGS. 27A and 27B, a lateral 2D superlattice structure S10 according to an embodiment may be arranged on a substrate SUB10. The lateral 2D superlattice structure S10 may have a structure, in which a first 2D material M10 and a second 2D material M20 are alternately bonded. The 2D material-containing device may further include a first electrode element E10 connected to the first region of the lateral 2D superlattice structure S10 and a second electrode element E20 connected to the second region of the lateral 2D superlattice structure S10. A connecting element C10 may be further provided between the lateral 2D superlattice structure S10 and the second electrode element E20 for connecting the lateral 2D superlattice structure S10 to the second electrode element E20. The connecting element C10 may include a conductive layer or a semiconductor layer, and may be transparent.

Figure 28A:
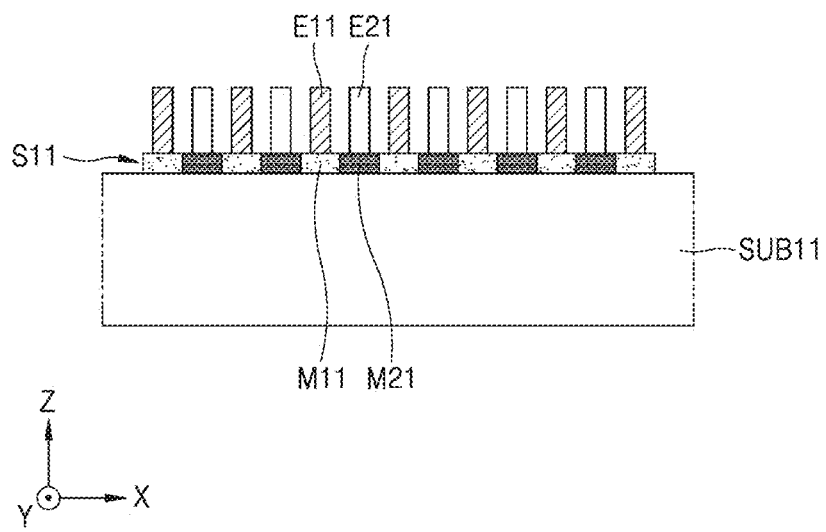
FIGS. 28A and 28B are respectively a cross-sectional view and a plan view of a 2D material-containing device according to another embodiment.
Figure 28B:
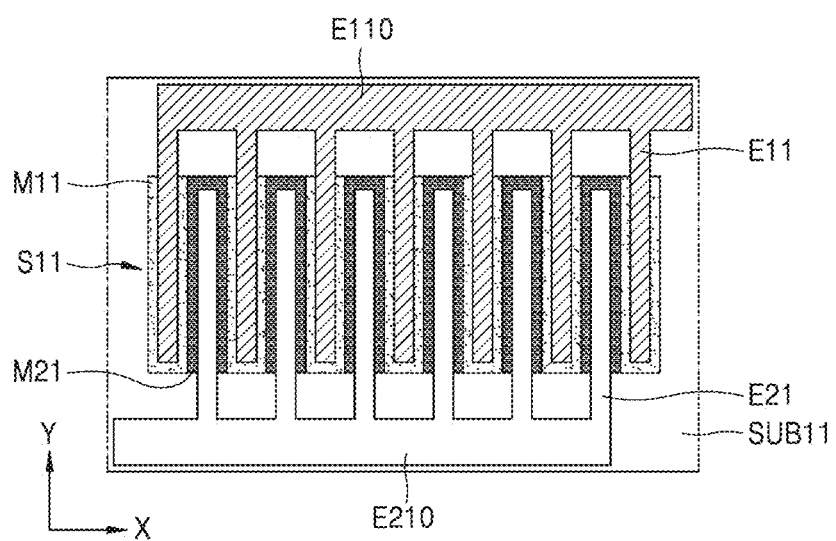

FIGS. 28A and 28B are respectively a cross-sectional view and a plan view of a 2D material-containing device according to another embodiment.

Referring to FIGS. 28A and 28B, a lateral 2D superlattice structure S11 may be provided on a substrate SUB11. The lateral 2D superlattice structure S11 may include a plurality of first and second 2D material regions M11 and M12 that are alternately arranged. A plurality of first unit electrodes E11 may be connected to the plurality of first 2D material regions M11 and a first common electrode E110 may be connected to the plurality of first unit electrodes E11. The plurality of first unit electrodes E11 and the first common electrode E110 may configure a first electrode structure. A plurality of second unit electrodes E21 may be connected to the plurality of second 2D material regions M21 and a second common electrode E210 may be connected to the plurality of second unit electrodes E21. The plurality of second unit electrodes E21 and the second common electrode E210 may configure a second electrode structure.

The device described above with reference to FIGS. 27A to 28B may include the superlattice structures S10 and S11 including a P—N diode structure having the tuned bandgap, and may be used as a photodiode or a light-emitting device. The optical characteristics/performances of the device may be modulated and improved through the bandgap tuning.

Figure 29:
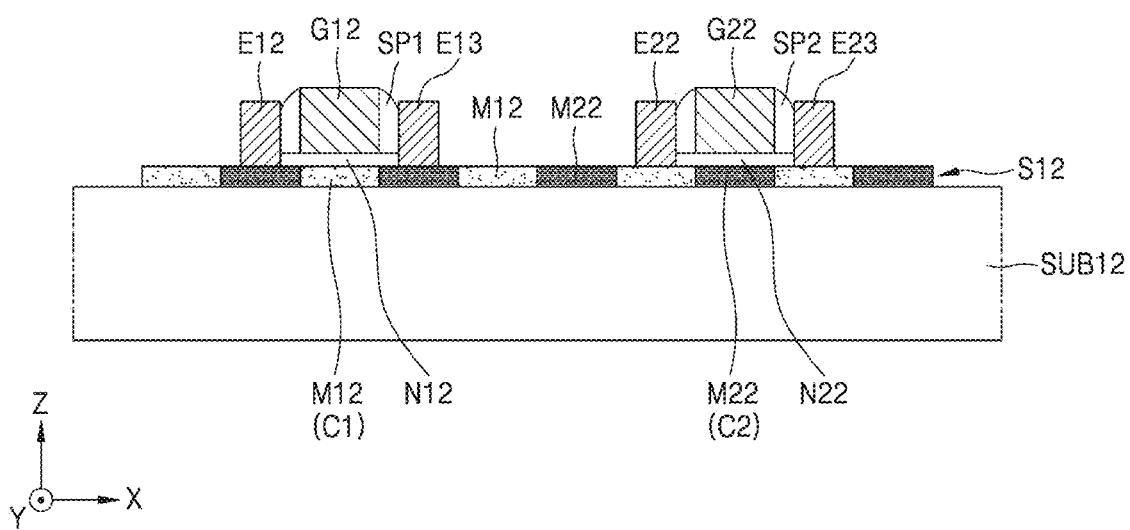
FIG. 29 is a cross-sectional view of a 2D material-containing device according to another embodiment.

FIG. 29 is a cross-sectional view of a 2D material-containing device according to another embodiment.

Referring to FIG. 29, a lateral 2D superlattice structure S12 according to an embodiment may be arranged on a substrate SUB12. The lateral 2D superlattice structure S12 may have a structure, in which a first 2D material M12 and a second 2D material M22 are alternately arranged. The lateral 2D superlattice structure S12 may include at least one selected from P—N—P, N—P—N, $P^+$—P—$P^+$, and $N^+$—N—$N^+$ bonding structures.

A first gate electrode G12 may be provided on a region corresponding to a first channel region C1, from among the plurality of first 2D materials M12. A first gate insulating layer N12 may be arranged between the first channel region C1 and the first gate electrode G12. A first sidewall insulating layer SP1 may be arranged on opposite sides of the first gate electrode G12. Also, first and second electrode elements E12 and E13 may be further provided on the superlattice structures S12 at opposite sides of the first channel region C1. One of the first and second electrode elements E12 and E13 may be a source electrode and the other may be a drain electrode.

A second gate electrode G22 may be provided on a region corresponding to a second channel region C2, from among the plurality of second 2D materials M22. A second gate insulating layer N22 may be arranged between the second channel region C2 and the second gate electrode G22. A second sidewall insulating layer SP2 may be arranged on opposite sides of the second gate electrode G22. Also, third and fourth electrode elements E22 and E33 may be further provided on the superlattice structures S12 at opposite sides of the second channel region C2. One of the third and fourth electrode elements E22 and E23 may be a source electrode and the other may be a drain electrode. When one of the first and second channel regions C1 and C2 is an N-channel region and the other is a P-channel region, the device according to an embodiment may be a complementary metal oxide semiconductor (CMOS) type device. However, in some embodiments, the device is not limited to a CMOS type device. Transistors may be configured on channel regions of the same type. Other various modifications may be allowed.

The device described with reference to FIG. 29 may be a field effect transistor (FET) type device. A mobility of a carrier (electron or hole) of the channel regions C1 and C2 in the device may be improved due to a strain effect. Therefore, the device may have excellent performances.

In embodiments, the lateral 2D superlattice structure may be applied to various optical devices such as an optoelectronic devices, photodetectors, photovoltaic devices, phototransistors, and photo diodes, and may be also applied to various electronic devices using the transistor or diode structure. In addition, in embodiments, the lateral 2D superlattice structure may be applied to various devices.

According to the embodiments, the lateral 2D superlattice structure having excellent performances and physical properties that are easily controlled, and the lateral 2D superlattice structure in which at least two 2D materials bonded to each other in a lateral direction may be implemented. A lateral 2D superlattice structures having a bandgap adjusted by a strain may be implemented. Various devices (electronic device/optical device) having excellent performances may be implemented by applying the lateral 2D superlattice structure thereto.

In the specification, many details are described in detail, but they are not provided to limit the scope of the disclosure, and should be interpreted as illustrating the embodiment. For example, one of ordinary skill in the art would appreciate that the configuration of the lateral 2D superlattice structure described above with reference to FIGS. 1, 2, 4 to 7, 9 to 16, and 19 to 26 may be variously modified. In detail, at least a part of the lateral 2D superlattice structure may have a multi-layer structure, not the monolayer (mono atomic layer), and in this case, general characteristics of the 2D material may be maintained. Also, material composition and entire shape of the superlattice structure may be variously modified. Also, a predetermined dopant material may be further added to the superlattice structure. In addition, the configuration of the device described above with reference to FIGS. 27A to 29 is an example, but the device to which the superlattice structure is applied may be variously modified. Thus, the scope of the disclosure should be determined by the technical idea set forth in the claims, not by the embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A lateral two-dimensional (2D) superlattice structure, comprising:
   at least two 2D materials that are different from each other and coherently bonded to each other in a lateral direction,
   an interfacial region of the at least two 2D materials being strained,
   the lateral 2D superlattice structure having a bandgap adjusted by the interfacial region that is strained such that a bandgap of the interfacial region is between a first bandgap of a first 2D material and a second bandgap of a second 2D material among the at least two 2D materials that are different from each other, the first 2D material and the second 2D material being coherently bonded to each other at the interfacial region, wherein
   the first 2D material is a first 2D transition metal dichalcogenide (TMDC) material,
   the second 2D material is a second 2D TMDC material,
   the first 2D TMDC material has the first bandgap in an intrinsic state thereof,
   the second 2D TMDC material has the second bandgap in an intrinsic state thereof,
   the first 2D TMDC material and the second 2D TMDC material have a same transition metal element or a same chalcogen element, and
   the bandgap of the interfacial region and an adjacent region have a third bandgap that is between the first bandgap and the second bandgap.

2. The lateral 2D superlattice structure of claim 1, wherein the interfacial region does not include dislocations or includes 1% or less dislocations.

3. The lateral 2D superlattice structure of claim 1, wherein the interfacial region of the at least two 2D materials has a lattice mismatch of 10% or less and has 10% or less strain due to the lattice mismatch.

4. The lateral 2D superlattice structure of claim 1, wherein the interfacial region has a bandgap variation rate of 30% or less with respect to one of the at least two 2D materials.

5. The lateral 2D superlattice structure of claim 1, wherein one or more of the at least two 2D materials include a metal atom among Mo, W, Nb, V, Ta, Ti, Zr, Hf, Tc, Re, Cu, Ga, In, Sn, Ge, or Pb, and a chalcogenide atom among S, Se, or Te.

6. The lateral 2D superlattice structure of claim 1, wherein the lateral 2D superlattice structure has a structure, in which two kinds of 2D materials are alternately and repeatedly arranged or three kinds of 2D materials are periodically arranged.

7. The lateral 2D superlattice structure of claim 1, wherein the lateral 2D superlattice structure has two or more kinds of 2D materials that are arranged to have a uniform width, a uniform ratio, or both a uniform width and a uniform ratio.

8. The lateral 2D superlattice structure of claim 1, wherein the lateral 2D superlattice structure includes two or more kinds of 2D materials that are arranged to have different widths in the lateral direction according to locations thereof, different width ratios in the lateral direction from each other according to locations thereof, or both different widths in the lateral direction and different width ratios in the lateral direction from each other according to locations thereof.

9. The lateral 2D superlattice structure of claim 1, wherein the at least two 2D materials included in the lateral 2D superlattice structure each have a width of 1000 nm or less.

10. The lateral 2D superlattice structure of claim 1, wherein the lateral 2D superlattice structure has a triangle shape or a square shape when seen from above.

11. The lateral 2D superlattice structure of claim 1, wherein the lateral 2D superlattice structure includes a P—N—P bonding structure, an N—P—N bonding structure, a $P^+$—P—$P^+$ bonding structure, an $N^+$—N—$N^+$ bonding structure, or a combination thereof.

12. The lateral 2D superlattice structure of claim 1, wherein
the lateral 2D superlattice structure includes a plurality of regions having different bandgaps from one another.

13. A two-dimensional (2D) material-containing device, comprising:
the lateral 2D superlattice structure of claim 1; and
at least one electrode member connected to the lateral 2D superlattice structure.

14. The 2D material-containing device of claim 13, wherein
the 2D material-containing device includes an electronic device.

15. The 2D material-containing device of claim 13, wherein
the 2D material-containing device includes an optical device.

16. The 2D material-containing device of claim 13, wherein
the 2D material-containing device includes at least one of a diode type device or a transistor type device.

17. The 2D material-containing device of claim 13, wherein
the lateral 2D superlattice structure includes a plurality of first 2D material regions and a plurality of second 2D material regions that are alternately arranged,
the 2D material-containing device further includes a first electrode structure connected to the plurality of first 2D material regions, and
the 2D material-containing device further includes a second electrode structure connected to the plurality of second 2D material regions.

18. The 2D material-containing device of claim 13, further comprising:
a first gate structure; and
the lateral 2D superlattice structure includes an N-channel region and a P-channel region, and
the first gate structure is on the N-channel region, and
the second gate structure is on the P-channel region.

19. A two-dimensional (2D) superlattice structure, comprising:
at least two 2D materials that are different from each other and bonded to each other in a lateral direction,
an interfacial region of the at least two 2D materials being strained,
the lateral 2D superlattice structure having a bandgap adjusted by the interfacial region that is strained, wherein
the at least two 2D materials include a first 2D material and a second 2D material,
a first region of the lateral 2D superlattice structure includes the first 2D material and the second 2D material bonded to each other at a first width ratio in the lateral direction,
a second region of the lateral 2D superlattice structure includes the first 2D material and the second 2D material bonded to each other at a second width ratio in the lateral direction that is different from the first width ratio in the lateral direction,
the first region has a first adjusted bandgap, and
the second region has a second adjusted bandgap that is different from the first adjusted bandgap.

20. A two-dimensional (2D) material-containing device, comprising:
a lateral two-dimensional (2D) superlattice structure including at least two 2D materials that are different from each other and bonded to each other in a lateral direction,
an interfacial region of the at least two 2D materials being strained,
the lateral 2D superlattice structure having a bandgap adjusted by the interfacial region that is strained;
a first electrode element connected to a first region of the lateral 2D superlattice structure;
a second electrode element connected to a second region of the lateral 2D superlattice structure; and
a connecting element between the lateral 2D superlattice structure and the second electrode element for connecting the lateral 2D superlattice structure to the second electrode element.

* * * * *